United States Patent
Spengler

(10) Patent No.: US 7,177,222 B2
(45) Date of Patent: Feb. 13, 2007

(54) REDUCING POWER CONSUMPTION IN A DATA STORAGE SYSTEM

(75) Inventor: David Louis Spengler, Colorado Springs, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 11/072,818

(22) Filed: Mar. 4, 2005

(65) Prior Publication Data

US 2006/0198225 A1   Sep. 7, 2006

(51) Int. Cl.
*G11C 5/14* (2006.01)
*G11C 7/00* (2006.01)
*G06F 1/26* (2006.01)
*G06F 1/32* (2006.01)

(52) U.S. Cl. ............ 365/229; 365/222; 365/227; 711/106; 713/320

(58) Field of Classification Search ........ 365/227, 365/222, 228, 229; 711/106; 713/320, 300
See application file for complete search history.

(56) References Cited

U.S. PATENT DOCUMENTS

| | | | |
|---|---|---|---|
| 3,771,132 A | 11/1973 | Biewer | |
| 3,823,388 A | 7/1974 | Chadima, Jr. et al. | |
| 3,941,989 A | 3/1976 | McLaughlin et al. | |
| 4,030,086 A | 6/1977 | Salem | |
| 4,151,454 A | 4/1979 | Iida | |
| 4,193,026 A | 3/1980 | Finger et al. | |
| 4,203,103 A | 5/1980 | Osada et al. | |
| 4,390,841 A | 6/1983 | Martin et al. | |
| 4,525,055 A | 6/1985 | Yokoo | |
| 4,734,855 A * | 3/1988 | Banatre et al. | 711/164 |
| 4,870,369 A * | 9/1989 | Bartenstein et al. | 330/59 |
| 4,901,283 A * | 2/1990 | Hanbury et al. | 365/222 |
| 4,907,183 A | 3/1990 | Tanaka | |
| 5,157,634 A | 10/1992 | Dhong et al. | |
| 5,247,655 A | 9/1993 | Khan et al. | |
| 5,265,102 A * | 11/1993 | Saito | 714/743 |
| 5,283,764 A * | 2/1994 | Kim et al. | 365/222 |
| 5,284,719 A | 2/1994 | Landau et al. | |
| 5,353,430 A | 10/1994 | Lautzenheiser | |
| 5,404,543 A * | 4/1995 | Faucher et al. | 713/323 |
| 5,430,680 A | 7/1995 | Parris | |
| 5,455,801 A | 10/1995 | Blodgett et al. | |
| 5,485,429 A | 1/1996 | Ono | |
| 5,594,699 A * | 1/1997 | Nomura et al. | 365/226 |
| 5,712,825 A * | 1/1998 | Hadderman et al. | 365/222 |

(Continued)

FOREIGN PATENT DOCUMENTS

JP   52135633 A   11/1977

(Continued)

*Primary Examiner*—Amir Zarabian
*Assistant Examiner*—Michael Weinberg
(74) *Attorney, Agent, or Firm*—David K. Lucente; Derek J. Berger

(57) ABSTRACT

An apparatus and associated method for reducing power consumption in an electronic circuit comprising a refresh load device being employed alternatively between an operational mode and a state refresh mode. A supply voltage level to the refresh load device is adjusted in relation to which of the operational and state refresh modes is employed and in relation to which of a primary alternating current derived power source or a backup battery power source is employed.

15 Claims, 5 Drawing Sheets

U.S. PATENT DOCUMENTS

| | | | |
|---|---|---|---|
| 5,717,644 A * | 2/1998 | Hadderman et al. ........ 365/222 |
| 5,787,294 A * | 7/1998 | Evoy .......................... 713/320 |
| 5,818,762 A | 10/1998 | Maari et al. |
| 5,852,582 A | 12/1998 | Cleveland et al. |
| 5,898,880 A | 4/1999 | Ryu |
| 5,986,435 A | 11/1999 | Koenck |
| 6,005,436 A * | 12/1999 | Shibayama et al. ......... 327/546 |
| 6,043,630 A | 3/2000 | Koenck et al. |
| 6,307,349 B1 | 10/2001 | Koenck et al. |
| 6,307,394 B1 | 10/2001 | Farnworth et al. |
| 6,377,028 B1 | 4/2002 | Armstrong, II et al. |
| 6,389,505 B1 | 5/2002 | Emma et al. |
| 6,512,715 B2 * | 1/2003 | Okamoto et al. ........... 365/227 |
| 6,529,840 B1 | 3/2003 | Hing |
| 6,553,501 B1 | 4/2003 | Yokoe |
| 6,611,921 B2 | 8/2003 | Casebolt et al. |
| 6,630,814 B2 | 10/2003 | Ptasinski et al. |
| 6,642,719 B1 | 11/2003 | Seto |
| 6,671,552 B2 | 12/2003 | Merritt et al. |
| 6,704,629 B2 | 3/2004 | Huang |
| 6,737,831 B2 | 5/2004 | Champlin |
| 6,903,994 B1 * | 6/2005 | Schoenfeld ................. 365/227 |
| 7,082,073 B2 * | 7/2006 | Casper ....................... 365/222 |
| 2004/0267483 A1 * | 12/2004 | Percer et al. ............... 702/118 |
| 2006/0002220 A1 * | 1/2006 | Spengler ..................... 365/222 |

FOREIGN PATENT DOCUMENTS

| | | |
|---|---|---|
| JP | 06060647 A | 3/1994 |
| WO | WO 90/15999 A1 | 12/1990 |

* cited by examiner

US 7,177,222 B2

REDUCING POWER CONSUMPTION IN A DATA STORAGE SYSTEM

FIELD OF THE INVENTION

The claimed invention relates generally to the field of electronic circuitry and more particularly, but not by way of limitation, to an apparatus and method for reducing power consumption in a circuit having a refreshed device, such as dynamic random access memory (DRAM).

BACKGROUND

Electronic circuitry generally requires a stable supply of electrical energy to function properly. Power is typically provided from a source that is set or is settable to one or more voltage levels, such as +3.3 volts (V) and the like. Current is drawn from the respective voltage level to meet the specified requirements of devices in the circuit. The devices can operate at a variety of modes, with each mode associated with a different level of energy consumption.

A refreshed circuit device includes an operational mode and a refresh mode, with the operational mode relating to its operational interaction with other circuitry and the refresh mode relating to actions taken place to maintain the device in a given state. For example, dynamic random access memory (DRAM) provides an array of storage cells that store electrical charge in order to serve as a memory space for digital data. Data are read from and written to the various cells to carry out a data transfer operation with other circuitry.

The storage cells lose the stored charge at a given decay rate, being sometimes characterized as "leaky capacitors." For this reason, the cells must be recharged, or "refreshed," from time to time in order to maintain a given logical memory state. Some memories invoke a self-refreshing cycle whereby the memory reads the present state of the array of storage cells and then rewrites that same state to the array. By refreshing the array at a rate faster than the decay rate, the logical state is maintained in the memory.

A minimum operating current is specified for a particular memory that is necessary to sustain all the memory operations; that is, to sustain the memory during operations associated with both the standard and the refresh modes. Typically, the memory will also be rated for operation within a specified voltage range. The standard operating mode typically requires relatively more power in comparison to the refresh mode. This means that under certain conditions and arrangements it might be possible to save power when operating in the refresh mode for extended periods of time associated with low utilization of the memory. What is needed is a solution that optimizes memory availability for system reliability, as well as minimizing power consumption for extended battery life. It is to these improvement features that the embodiments of the present invention are directed.

SUMMARY OF THE INVENTION

Embodiments of the present invention are generally directed to a power savings arrangement for a circuit containing a refresh device.

In some embodiments a method is provided for reducing power consumption in an electronic circuit comprising a refresh load device being employed alternatively between an operational mode and a state refresh mode. The method comprises adjusting a supply voltage level to the refresh load device in relation to which of the modes is employed.

In some embodiments a circuit is provided comprising a power regulator that is responsive to a mode of a self refresh device in adjusting a supply voltage level to the self refresh device when the self refresh device is in a refresh mode.

In some embodiments a data storage device is provided comprising a self-refresh memory, and means for reducing power consumption by the data storage device in relation to utilization of the memory. These and various other features and advantages which characterize the claimed invention will become apparent upon reading the following detailed description and upon reviewing the associated drawings.

DETAILED DESCRIPTION

Figure 1:
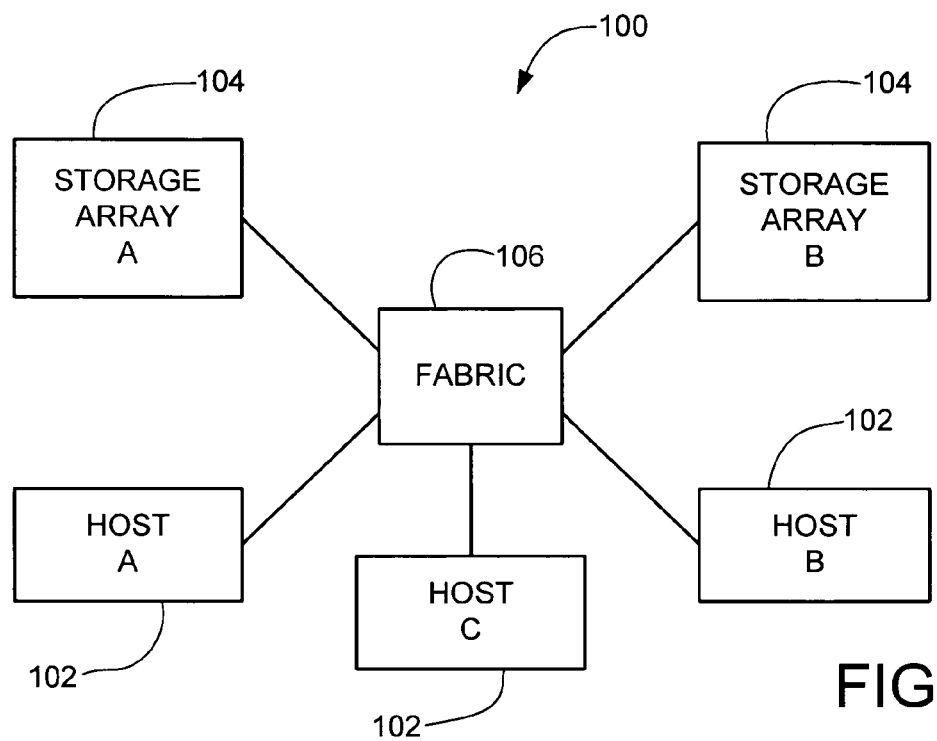
FIG. 1 is a top level functional block depiction of a computer-based system characterized as a wide-area network utilizing mass storage.

To illustrate an exemplary environment in which presently preferred embodiments of the present invention can be advantageously practiced, FIG. 1 shows a computer-based system 100 characterized as a wide area network (WAN) utilizing mass storage.

The system 100 includes a number of host computers 102, respectively identified as hosts A, B and C. The host computers 102 interact with each other as well as with a pair of data storage arrays 104 (denoted A and B, respectively) via a fabric 106. The fabric 106 can be characterized as a fibre-channel based switching network, although other configurations can be utilized as well including the Internet.

It is contemplated that the A host computer 102 and the A data storage array 104 are physically located at a first site, the B host computer 102 and B storage array 104 are physically located at a second site, and the C host computer 102 is at yet a third site, although such is merely illustrative and not limiting.

Figure 2:
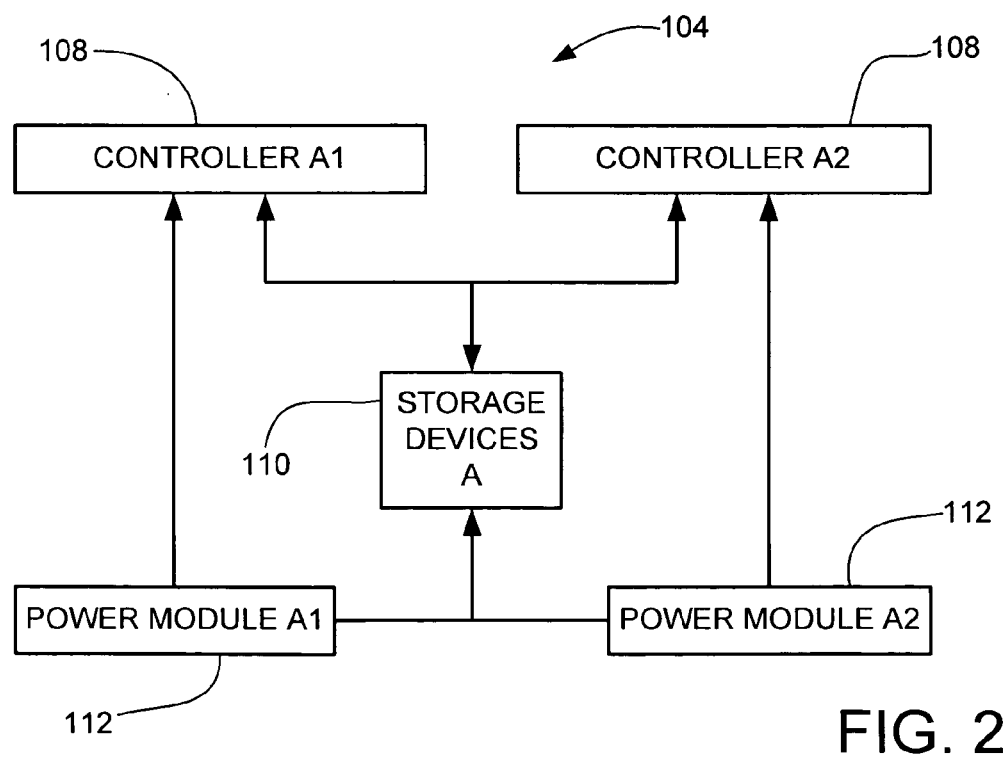
FIG. 2 illustrates the general architecture of a selected one of the data storage arrays of FIG. 1.

As shown in FIG. 2, each array 104 can include a pair of controllers 108 (denoted A1/A2) and a set of data storage devices 110 preferably characterized as hard disc drives operated as a redundant array of independent discs (RAID). The controllers 108 and devices 110 preferably utilize a fault tolerant arrangement so that the various controllers 108 utilize parallel, redundant links and at least some of the user data stored by the system 100 is mirrored and/or parity data is stored for recovery in the event of a storage failure.

Each array 104 further includes a pair of power modules 112 (denoted A1/A2) which supply electrical power to the controllers 108 and the storage devices 110. The power modules 112 are preferably configured to operate in tandem so that during normal operation the power module A1 supplies power to the controller A1 and to half of the devices 110, and the power module A2 supplies power to the controller A2 and to the other half of the devices 110. Each power module 112 is further sized and configured to be able to individually supply all of the power for the array 104 should the other power module 112 become inoperative.

Figure 3:
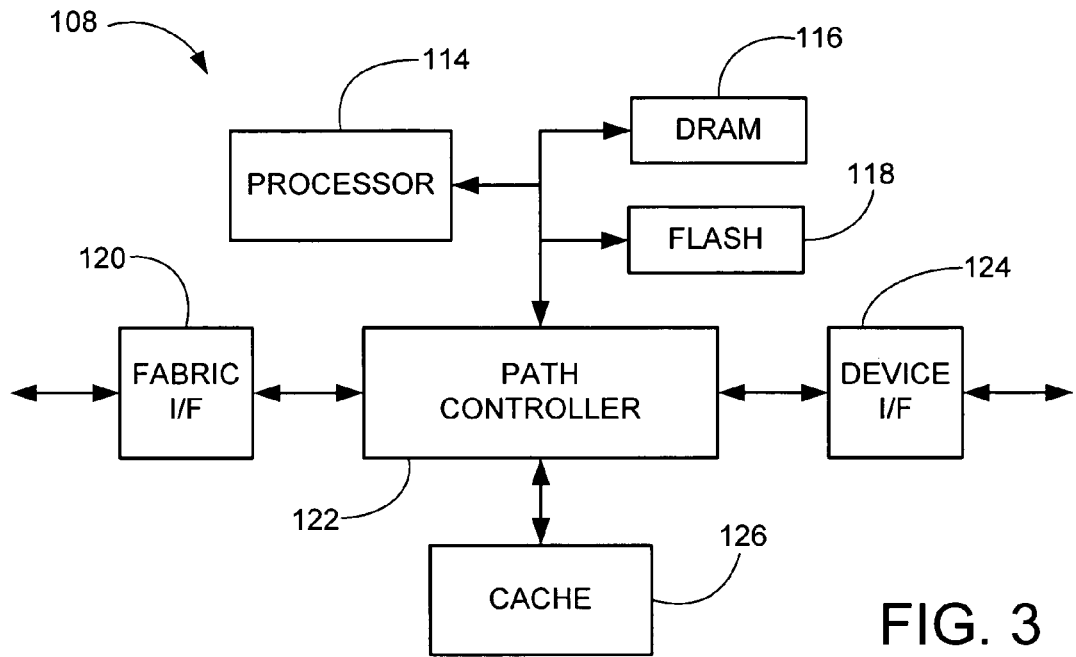
FIG. 3 provides a functional block diagram of a selected one of the controllers of FIG. 2.

FIG. 3 provides a functional diagram of a selected one of the controllers 108 of FIG. 2. A main processor 114 uses programming and data stored in refreshed memory 116 (DRAM) and non-volatile memory (flash) 118 to provide top level control. A communication path is provided by a fabric interface (I/F) block 120, a path controller 122 and a device interface (I/F) block 124.

A refreshed cache memory device 126 provides a memory space for the temporary storage of data being transferred between the host computers 102 and the storage devices 110. For reference, the cache 126 is preferably characterized as one or more DRAM modules having a total selected storage capacity.

Figure 4:
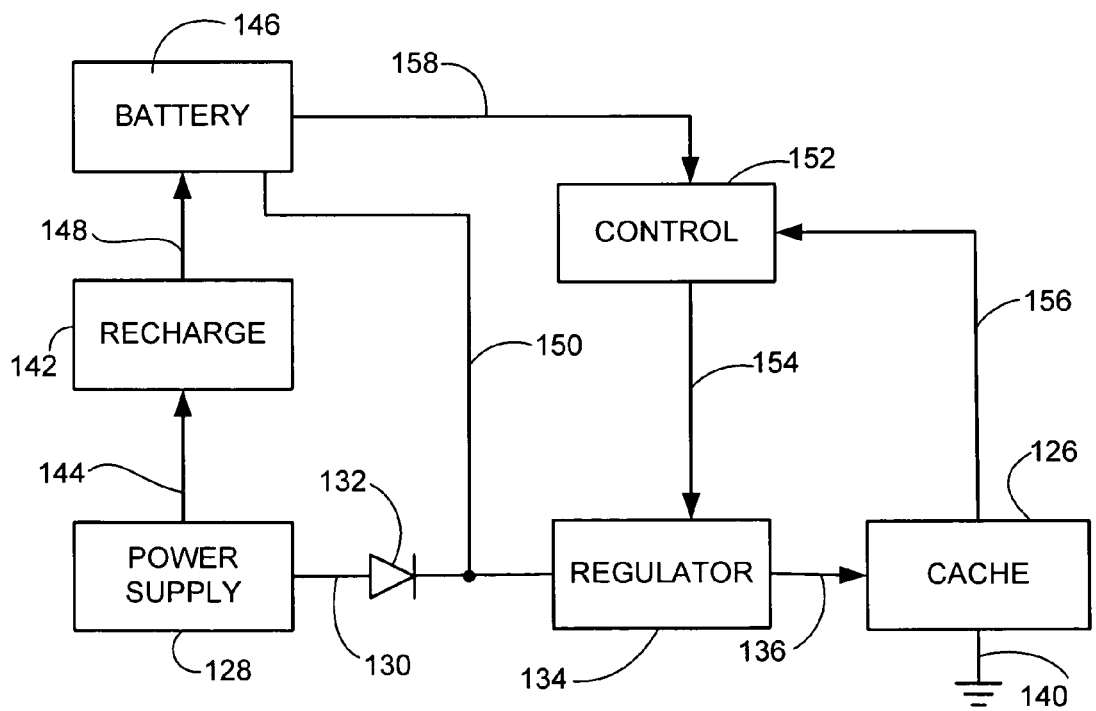
FIG. 4 illustrates relevant portions of one of the power modules of FIG. 2 constructed and operated in accordance with embodiments of the present invention to supply primary and backup power to the cache memory of the controller of FIG. 3.

FIG. 4 shows relevant portions of the circuit forming a selected one of the power modules 112 of FIG. 2. It will be understood that FIG. 4 is generally directed to that portion of the module 112 that provides operational and standby (backup) power to the cache 126.

A power supply 128 operates to receive input AC power from a domestic source (not shown) and output various associated DC voltages on different supply paths, such as the path 130 which can be provided at nominally 12V.

This voltage is supplied through protection diode 132 to a regulator 134 which applies voltage regulation to provide an output regulated voltage to path 136. The regulated voltage supplies the cache 126. Ground connection 140 denotes the completion of this main power supply loop.

A battery recharge circuit 142 receives input voltage from the power supply 128 via path 144 to selectively apply recharging current to a battery 146 (or other backup power source) via path 148. The battery 146 is configured to supply standby (backup) power to the cache 126 during an anomalous condition such as the failure or other unavailability of the alternating current derived power supply 128. In this manner the battery 146 serves to maintain the cache 126 in a continuous self-refresh mode, and thereby maintaining the logical state of stored memory, until the power supply 128 is restored to service.

The battery 146 supplies an output voltage, such as on the order of four to six volts, via path 150. Although not shown, the path 150 can include a switching element to disconnect the voltage supplied by the battery 146. Otherwise, by connecting both the battery 146 and the power supply 128 in the circuit, or by biasing any switching element closed, then assurance of immediate standby power is provided in the event of an interruption of the power supply 128.

The power regulator 134 is responsive to a control block 152 via path 154 in adjusting a supply voltage level to the cache 126. The control block 152 can comprise hardware or a software/firmware routine, as desired. The control block 152 deterministically signals a trigger based on an input received via path 156 regarding the present mode of the cache 126; that is, whether the cache 126 is presently employed in a standard operational mode or alternatively in a refresh mode. The control block 152 also receives an input via path 158 regarding whether the battery 146 is presently employed in powering the cache 126.

Generally, the control block 152 operates on the circuit to reduce the supply voltage on path 136 commensurate with the relatively lower power requirements of the cache 126 during a self refresh mode, in comparison to the standard operational mode. For example, a particular memory array used to provide the cache 126 might require a 36 mA current and operate within a voltage range of 2.3V to 2.7V in order to sustain the self-refresh functionality. A nominal voltage of 2.6V might be used for purposes of sustaining the standard operational mode of the cache 126. This arrangement expends 9.36 watt-hours of power during a 100 hour interval (2.6*0.036*100). If the voltage is reduced to 2.4V, then 8.64 watt-hours of power would be expended during an equivalent interval (2.4*0.036*100). Accordingly, a 7% reduction in the overall power requirement can be achieved by reducing the supply voltage from 2.6V to 2.4V during the interval. Such a savings can significantly increase the useful life of a charged battery 146 supplying the refresh power during the interval.

Figure 5:
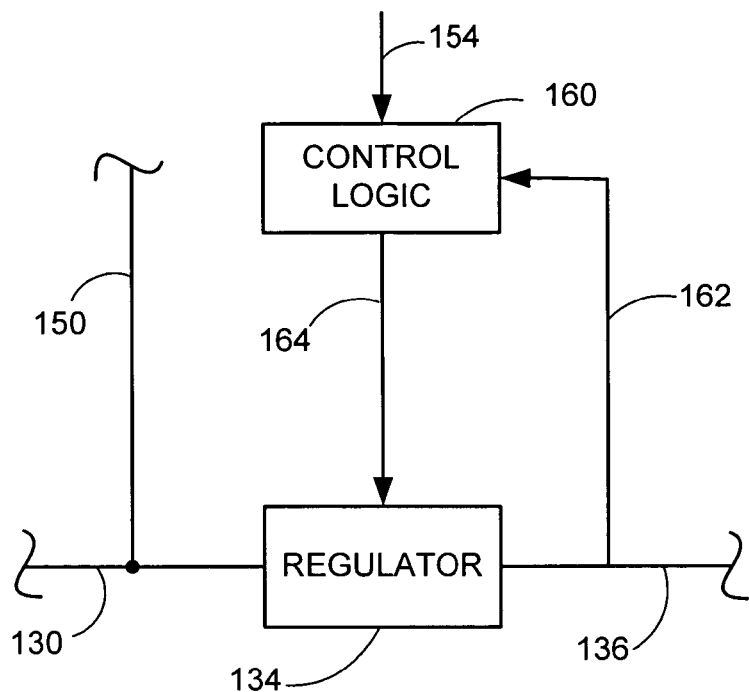
FIG. 5 is a diagrammatic illustration of the multi-state feedback control element of the power regulator.

FIG. 5 is a diagrammatic illustration of a logical control of the regulator 134 in accordance with embodiments of the present invention. A multi-state feedback control element 160 receives the trigger signal from the control block 152 via path 154 in order to adjust the output voltage on path 136 to the cache 126. The control logic 160 is illustrated generally as being responsive to a feedback voltage signal via path 162 and providing a reference voltage to the regulator 134 via path 164.

In some embodiments the voltage regulator, such as regulator 134, use an internal voltage reference, such as provided by path 164, and external resistive divider circuitry, such as path 162, to set the output voltage level, such as on path 136. In this manner, the output voltage can be changed by adjusting either the internal reference or the resistive divider circuitry. The internal reference is sometimes not easily accessible for manipulation, and in that case it is preferable to manipulate the resistive divider circuitry.

Figure 6:
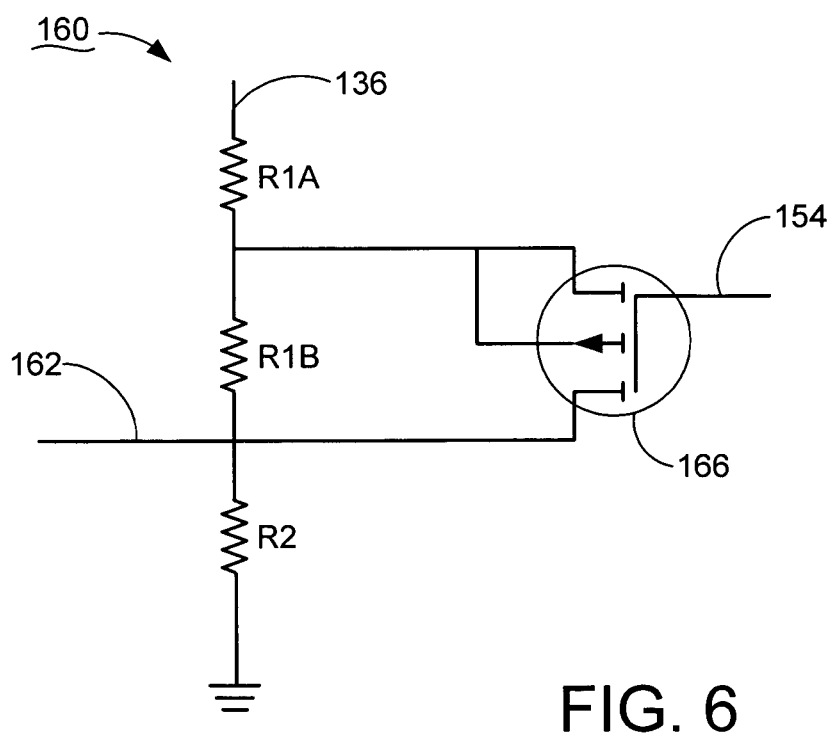
FIG. 6 is a feedback control constructed in accordance with embodiments of the present invention comprising a transistor in parallel with resistive elements.

FIG. 6 is a diagrammatic illustration of a feedback control element 160 constructed in accordance with embodiments of the present invention wherein the resistive divider circuitry is manipulated to vary the voltage from the regulator 134. A transistor 166 is used in parallel with an additional resistive element R1B in modifying the resistive circuit otherwise containing resistive elements R1A and R2. The transistor 166 receives the trigger signal from the control block 152 via path 154. In a standard operational mode, the transistor 166 is not part of the energy path so the output voltage equation can be represented mathematically, such as by $k*((R1A+R1B)/R2+1)$. This voltage equation is reduced to $k*(R1A/R2+1)$ when the trigger signal switches the transistor 166 so that it is part of the energy path, thereby shorting around the resistive element R1B. The illustrative embodiments characterized by FIG. 6 provide only two voltage levels. However, two or more such switching arrangements in parallel with resistive elements can be added to the resistive divider circuitry to provide more than two output voltage levels for the regulator 134. Whether two or more output voltage levels are desired, in alternative equivalent embodiments the multi-state feedback control element can comprise a digital potentiometer or a digital margining device instead of resistive divider circuitry.

Figure 7:
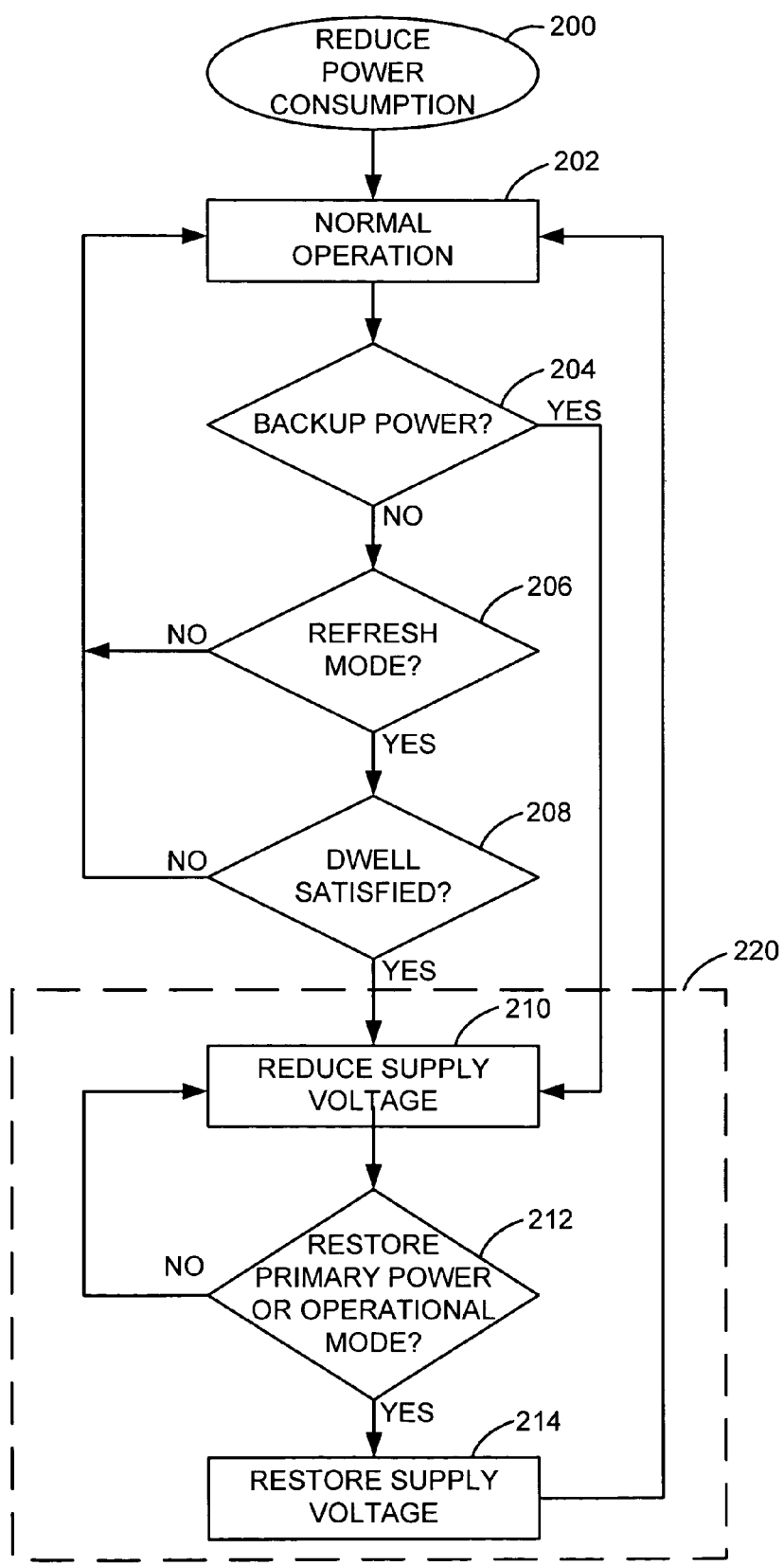
FIG. 7 is a flowchart of steps for performing a method for reducing power consumption in accordance with embodiments of the present invention.

FIG. 7 is a flowchart of a method 200 for reducing power consumption in an electronic circuit comprising a refresh load device, such as cache 126, that is employed alternatively between an operational mode and a state refresh mode in accordance with embodiments of the present invention. The method interrupts otherwise normal operations in block 202 when either determination block 204 or when determination blocks 206 and 208 are affirmative.

Determination block 204 ascertains whether the control block 152 has sensed a switch from the power supply 128 to backup power by the battery 146. If the determination of block 204 is affirmative, then control passes to block 210 where the control block 152 sends the trigger signal to reduce the supply voltage from the regulator 134. If the first determination of block 204 is negative, then control passes to block 206.

Determination block 206 ascertains whether the control block 152 has sensed a switch in the cache 126 from the operational mode to the refresh mode. If the determination of block 206 is negative, then control returns to normal operations in block 202; however, if it is affirmative then control passes to block 208. Determination block 208 ascertains whether a preselected dwell time in the refresh mode has been satisfied. An extended period in the refresh mode beyond a preselected threshold is likely a low utilization indicator of the cache 126, during which it can be advantageous to reduce power thereto. If the determination of block 208 is negative, control returns to normal operations in block 202; however, if it is affirmative then control passes to block 210.

After the supply voltage to the cache 126 has been reduced in block 210, a determination is made in block 212 as to whether there is a return to the power supply 128 or to an operational mode of the cache 126. If the determination of block 212 is negative, then control remains in block 210 to maintain the reduced supply voltage; however, if it is affirmative then in block 214 the trigger signal from control block 152 switches the regulator 134 to once again provide the increased supply voltage to the cache 126.

Figure 8:
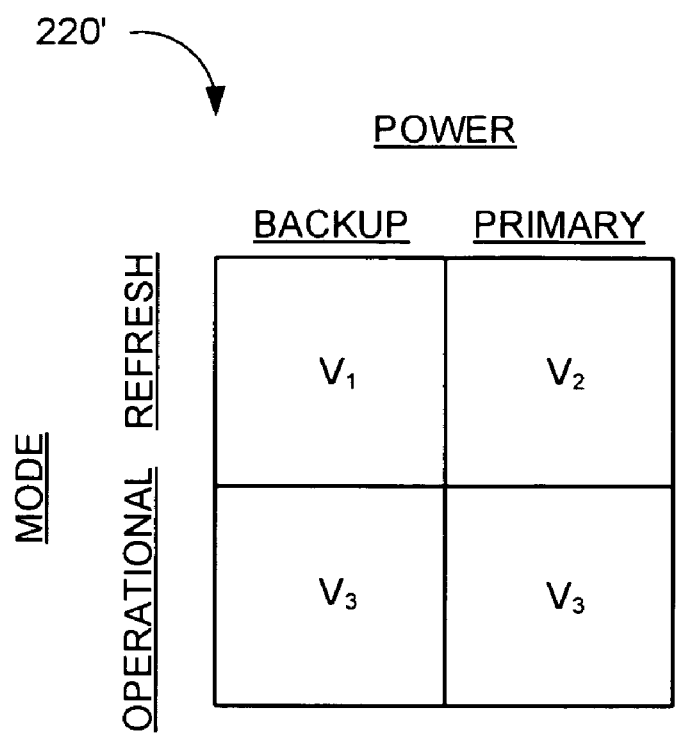
FIG. 8 is a diagrammatic illustration of a deterministic logic matrix for a control that selectively alters the supply voltage to the cache.

The embodiments of FIG. 7 contemplate a dual output voltage arrangement, such as can be provided by the feedback control discussed above in reference to FIG. 6. As discussed above, however, it might be desirable to switch the output voltage to more than just two levels. For example, the portion of the method 200 that changes the voltage, denoted 220, can be replaced with the deterministic logic matrix 220' of FIG. 8. According to this scheme, a lowest level voltage $V_1$ is provided when the cache 126 is supplied with backup power and in refresh mode. An intermediate voltage $V_2$ is provided when primary power is utilized and in refresh mode. An operational voltage $V_3$ is provided regardless of power supply. In exemplary embodiments these voltages have been set at 2.4V, 2.5V, and 2.6V, respectively, for the voltage levels $V_1$, $V_2$, and $V_3$. The intermediate voltage, in this case $V_2$, aids in smoothing voltage transitions between modes to make response times more capable in responding within the refresh time requirements.

It will now be appreciated that preferred embodiments of the present invention are generally directed to a method and apparatus for reducing power consumption of an electronic circuit during a time when a refresh device (such as 126) can be maintained in a self-refresh mode by an associated backup energy source (such as 146).

In accordance with some preferred embodiments, the method comprises operating the refresh device in a self-refresh mode to maintain the device in a selected state (such as step 206). The method can assess whether a predetermined dwell time has elapsed (such as step 208), or whether a backup battery power source has been enabled (such as step 204), in deterministically reducing a supply voltage to the refresh device (such as step 210).

Preferably, the method determines whether a return to an alternating current derived power source has occurred, or a return to a standard operational mode of the refresh device has occurred (such as step 212). If so, then the supply voltage to the refresh device is reset (such as step 214) and control returns to normal operations.

Energy can be supplied to the refresh device from a primary energy source (such as 128). The backup, or standby energy source is preferably characterized as comprising a backup battery which is selectively recharged by the first energy source. Preferably, the refresh device is characterized as a dynamic random access memory (DRAM), and the DRAM is preferably used as a cache memory device to temporarily store data transferred between a data storage device (such as 110) and a host device (such as 102).

A control block (such as 152) senses when the refresh device is in a self-refresh mode, and maintains a reduced supply voltage to the refresh device so long as the self refresh mode is continuous and the power is supplied by the backup power supply.

In some preferred embodiments a distributed data storage system is contemplated, comprising a self-refresh memory and means for reducing power consumption in relation to utilization of the memory. The means for reducing can be characterized by associating a voltage level supplied to the memory with whether the memory is in an operational mode or a refresh mode. The means for reducing can be characterized by automatically adjusting the voltage level in relation to a transition from one mode to the other mode. The means for reducing can be characterized by a means for regulating the voltage level. The means for reducing can be characterized by adjusting the voltage level in relation to a mode of a dual source power supply comprising a battery power source.

For purposes of the appended claims, the recited "means for reducing" will be understood to correspond at least without limitation to the disclosed control block 152. The recited "means for regulating" will be understood to correspond at least without limitation to the disclosed multi-state power regulator 134. The term "refresh" will be defined consistent with the foregoing discussion to require the addition of electrical charge to maintain a level of charge at or in a selected relation to a desired charge level.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed. For example, the particular elements may vary depending on the particular processing environment without departing from the spirit and scope of the present invention.

In addition, although the embodiments described herein are directed to a distributed data storage system, it will be appreciated by those skilled in the art that the claimed subject matter is not so limited and various other processing systems can utilize the embodiments of the present invention without departing from the spirit and scope of the claimed invention.

What is claimed is:

1. A method for reducing power consumption of a refresh load device in a circuit that is alternatively powered in one of an alternating current mode and a battery mode, the method comprising adjusting a refresh voltage level to the refresh load device to a lowest value in the battery mode, and adjusting a refresh voltage level to the refresh load device to an intermediate value in the alternating current mode, while maintaining a substantially constant operational voltage level to the refresh load device in both the battery mode and the alternating current mode.

2. The method of claim 1 wherein the adjusting step comprises employing a multi-state feedback controller providing the voltage level to the refresh device.

3. The method of claim 2 wherein the adjusting step is characterized by the multi-state feedback controller employing resistive divider circuitry.

4. The method of claim 2 wherein the adjusting step is characterized by the multi-state feedback controller employing digital potentiometer.

5. A circuit comprising a power regulator that is responsive to a mode of a self refresh device and responsive to a power supply mode in adjusting a refresh voltage level to the self refresh device to a lowest value while in a refresh mode and powered in a battery mode, in adjusting a refresh voltage level to the self refresh device to an intermediate value while in a refresh mode and powered in an alternating current mode, and in maintaining a substantially constant operational voltage level to the self refresh device while in an operational mode for both the battery mode and the alternating current mode.

6. The circuit of claim 5 wherein the power regulator comprises a multi-state feedback control element determining an output voltage from the power regulator.

7. The circuit of claim 6 wherein the multi-state feedback control element comprises a transistor in parallel with a resistive element.

8. The circuit of claim 6 wherein the multi-state feedback control element comprises a digital potentiometer.

9. The circuit of claim 6 wherein the multi-state feedback control element comprises a digital margining device.

10. The circuit of claim 5 wherein the intermediate refresh level voltage while in the refresh mode and powered in the alternating current mode is characterized as a smoothing voltage.

11. The circuit of claim 10 in a memory of a distributed data storage system.

12. The method of claim 2 wherein the adjusting step is characterized by the multi-state feedback controller employing a digital margining device.

13. The system method of claim 2 wherein the adjusting step is characterized by the multi-state feedback controller employing a deterministic logic matrix associating a selected voltage level supplied to the refresh device in relation to power mode and refresh device mode.

14. The circuit of claim 6 wherein the multi-state feedback control element comprises a deterministic logic matrix associating a selected voltage level supplied to the refresh device in relation to power mode and self refresh device operational mode.

15. The method of claim 1 wherein the adjusting step is characterized by applying the intermediate refresh level voltage as a smoothing voltage.

* * * * *